(12) United States Patent
Ohnishi

(10) Patent No.: US 7,442,928 B2
(45) Date of Patent: Oct. 28, 2008

(54) CHARGED PARTICLE BEAM APPARATUS

(75) Inventor: Tsuyoshi Ohnishi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 212 days.

(21) Appl. No.: 11/527,522

(22) Filed: Sep. 27, 2006

(65) Prior Publication Data

US 2007/0069158 A1    Mar. 29, 2007

(30) Foreign Application Priority Data

Sep. 29, 2005   (JP) .............................. 2005-284733

(51) Int. Cl.
*H01J 37/304* (2006.01)
(52) U.S. Cl. .................. 250/309; 250/492.21; 250/310
(58) Field of Classification Search ................ 250/309, 250/492.21, 310
See application file for complete search history.

(56) References Cited

U.S. PATENT DOCUMENTS

| | | | | |
|---|---|---|---|---|
| 5,401,972 | A | * | 3/1995 | Talbot et al. .............. 250/491.1 |
| 2006/0171593 | A1 | * | 8/2006 | Hayakawa et al. .......... 382/209 |

* cited by examiner

*Primary Examiner*—Kiet T Nguyen
(74) *Attorney, Agent, or Firm*—McDermott Will & Emery LLP

(57) ABSTRACT

When a sample includes repeated cells, a scale pattern corresponding to the repeated cells is generated. Next, the scale pattern generated is superimposed on the image of the repeated cells of the sample, thereby identifying a destination cell. Moreover, disposition of the repeated cells of the sample is determined based on positions of at least three ends of the repeated cells. Then, the position of the destination cell is identified from this disposition of the repeated cells. Furthermore, a zoom image is generated by a combination of a zoom based on beam deflection function and a zoom based on software. Then, the image shift is performed by software without displacing a sample stage.

21 Claims, 14 Drawing Sheets

FIG. 4
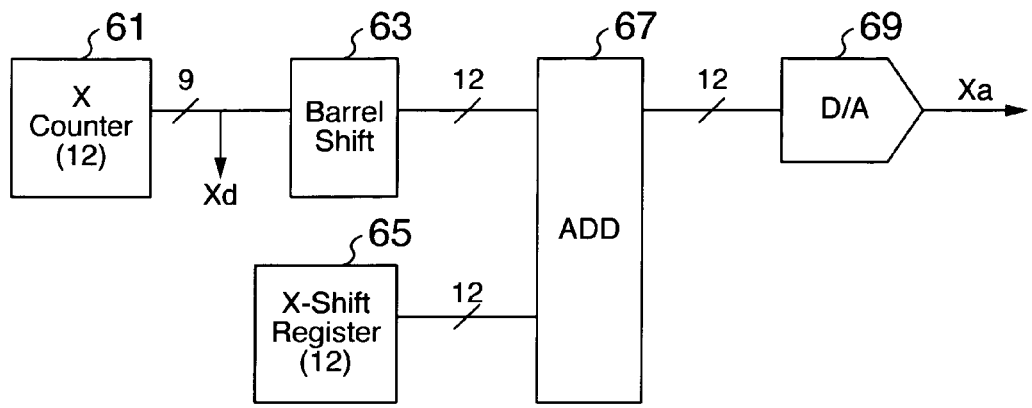
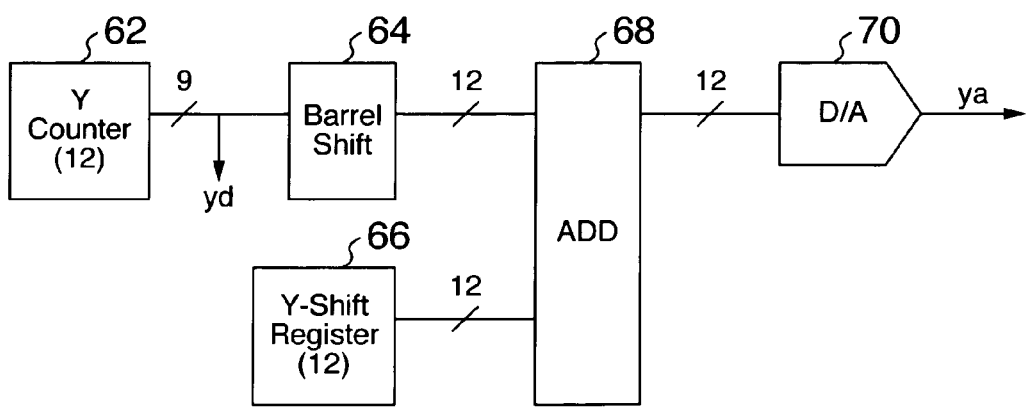
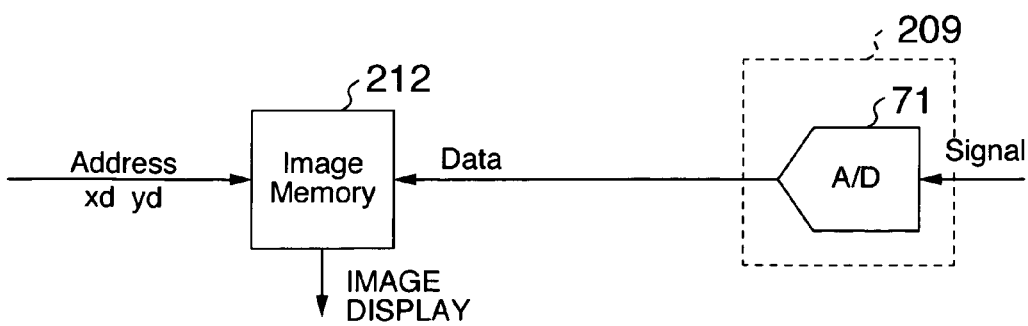

CHARGED PARTICLE BEAM APPARATUS

BACKGROUND OF THE INVENTION

1. Field of the Invention

The present invention relates to a charged particle beam apparatus for identifying a predetermined position in a sample having a repeated pattern.

2. Description of the Related Art

In the analysis of a defect or failure in a semiconductor memory, it is required to identify a memory cell which has the defect or failure. Conventionally, a scanning electron microscope (SEM) has been used in order to identify the memory cell which has the defect or failure. Namely, a sample stage is displaced with a pitch corresponding to the pitch between the memory cells while making a visual inspection of the SEM image of the sample, thereby counting the memory cells from an edge of the sample.

In recent years, in accompaniment with the fine miniaturization of semiconductor memory devices, each memory cell has been becoming tremendously smaller and smaller in size. Accurately identifying a specific memory cell requires implementation of the stage displacement accuracy at the submicron level. The conventional scanning electron microscope, however, has not had a sample stage mechanism whose accuracy is so high as to be able to identify the memory cell.

SUMMARY OF THE INVENTION

It is an object of the present invention to provide an apparatus which makes it possible to count memory cells, and to detect the position of a specific memory cell without using a high-accuracy sample stage mechanism.

In a charged particle beam apparatus according to the present invention, when a sample includes repeated memory cells, a scale pattern corresponding to the repeated memory cells is created. Next, the scale pattern created is superimposed on the image of the repeated memory cells of the sample, thereby identifying a destination memory cell.

Moreover, in the charged particle beam apparatus according to the present invention, when the sample includes the repeated memory cells, the position of the destination memory cell is identified from a disposition of the repeated memory cells of the sample.

Furthermore, in the charged particle beam apparatus according to the present invention, a zoom image is generated by a combination of a zoom based on beam deflection function and a zoom based on software. Then, the image shift is performed by software without displacing the sample stage.

According to the present invention, it becomes possible to count memory cells, and to detect the position of a specific memory cell without using a high-accuracy sample stage mechanism.

Other objects, features and advantages of the invention will become apparent from the following description of the embodiments of the invention taken in conjunction with the accompanying drawings.

BRIEF DESCRIPTION OF THE DRAWINGS

FIG. 4 is a diagram for explaining part of a deflection control system and an image generation system of the control apparatus in the first embodiment of the focused ion beam apparatus according to the present invention;

DETAILED DESCRIPTION OF THE INVENTION

Figure 1:
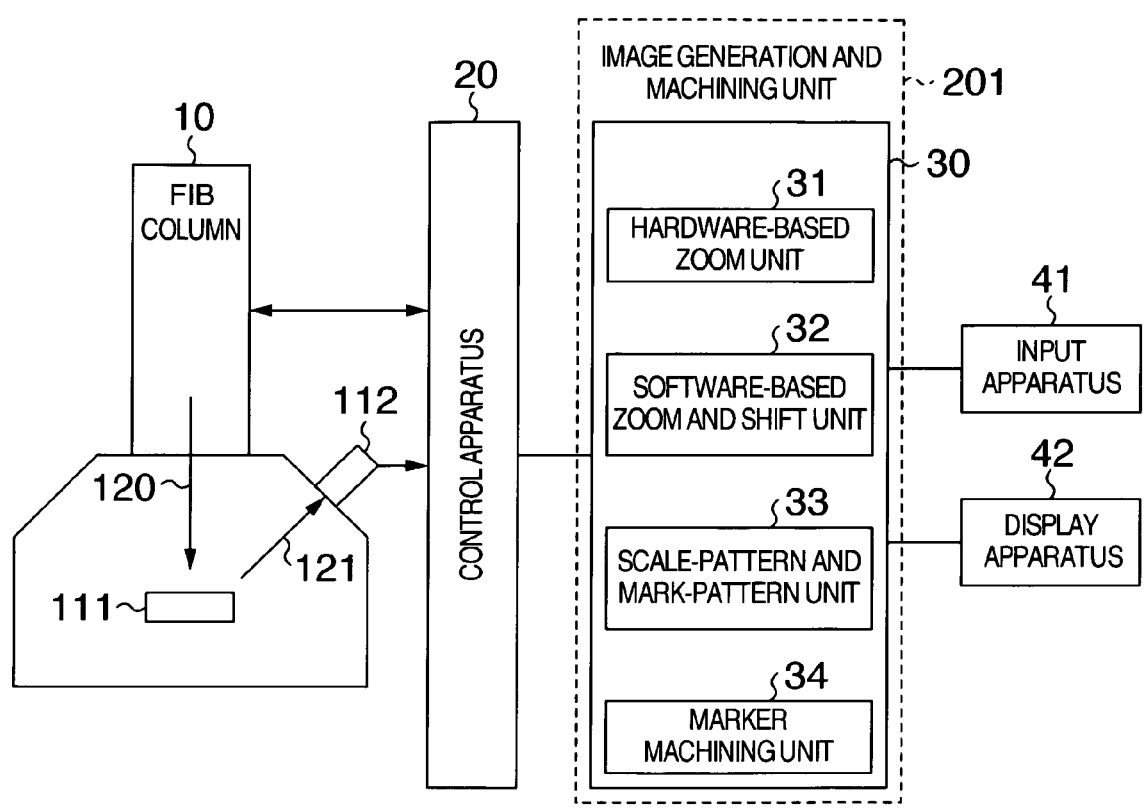
FIG. 1 is a diagram for illustrating a first embodiment of a charged particle beam apparatus according to the present invention.

FIG. 1 is a diagram for illustrating the schematic configuration of a charged particle beam apparatus according to the present invention. The charged particle beam apparatus of the present embodiment is a focused ion beam apparatus. The focused ion beam apparatus includes the following configuration components: A FIB column 10 for generating a focused ion beam 120 so as to irradiate a sample 111 with the focused ion beam 120, a detector 112 for detecting secondary electrons 121 emitted from the sample 111, a control apparatus 20, an image generation and machining unit 30, an input apparatus 41, and a display apparatus 42. The image generation and machining unit 30 inputs a secondary-electron beam signal from the detector 112 to generate a scanning-ion-microscope (: SIM) image, thereby machining a marker on the sample 111. The image generation and machining unit 30 includes a hardware-based zoom unit 31 for performing a hardware-based zoom, a software-based zoom and shift unit 32 for performing a software-based zoom and a software-based shift, a scale-pattern and mark-pattern unit 33 for performing the generation and display of a scale pattern and a mark pattern, and a marker machining unit 34 for machining the marker on the sample 111. The hardware-based zoom means the execution of a zoom by a beam deflection function. The software-based zoom means the scale-up of an image in a digital manner using an image processing. The software-based shift means-the displacement of an image in a digital manner using an image processing, i.e., displacing the image without displacing the sample stage.

Implementing the software-based zoom and the software-based shift requires that at least the beam deflection point resolution be larger than the image display resolution. In the present embodiment, the beam deflection point resolution is equal to 4096×4096 points, and the image display resolution is equal to 512×512 pixels. Accordingly, it becomes possible to implement the software-based zoom which exhibits an eight-time magnification at the maximum.

The image generation and machining unit 30 may also be a computer 201, or a program to be executed by the computer.

Figure 2:
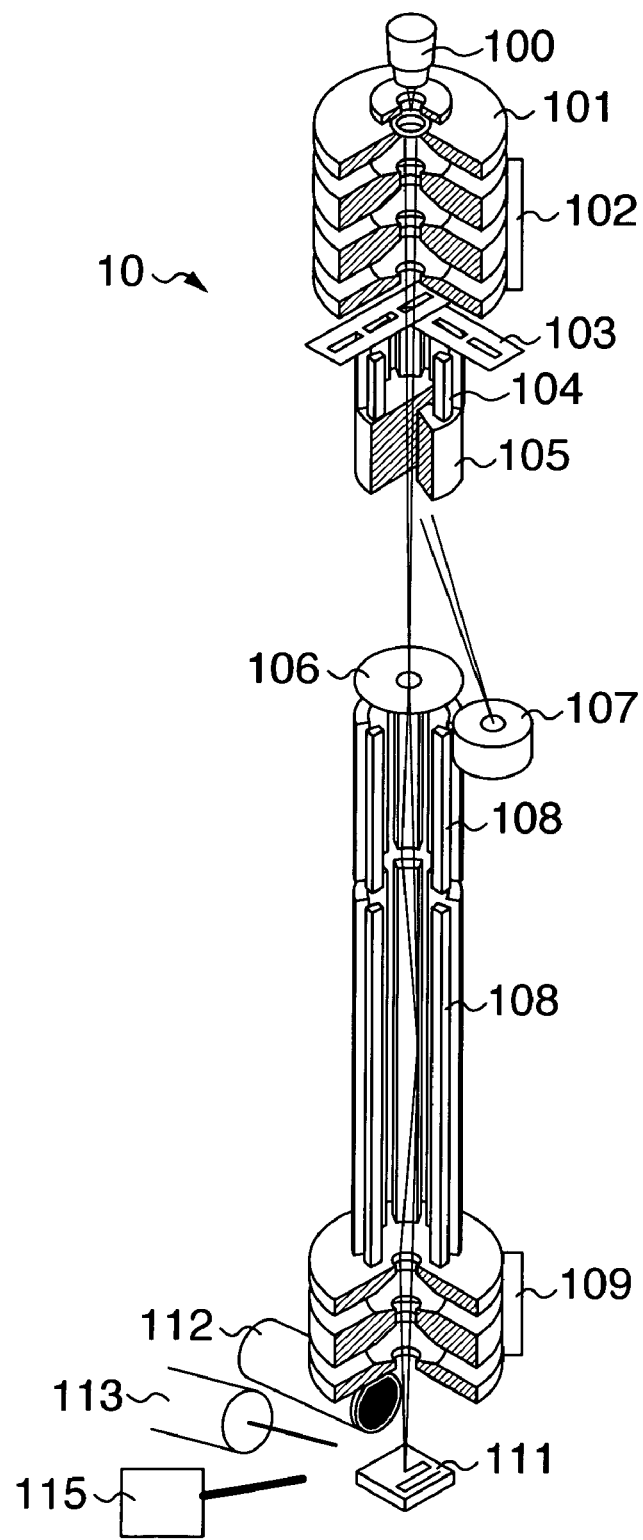
FIG. 2 is a detailed diagram of a FIB column of the focused ion beam apparatus according to the present invention.

FIG. 2 is a detailed diagram of the FIB column 10 of the focused ion beam apparatus according to the present invention. The FIB column 10 includes the following configuration components: A liquid-metal ion source emitter 100, an extraction electrode 101, a condenser lens 102, a variable aperture 103, an aligner/stigmator 104, a blanker 105, a blanking aperture 106, a Faraday cup 107, a deflector 108, and an objective lens 109. The focused ion beam apparatus further includes the detector 112 for detecting the secondary electrons 121 emitted from the sample 111, a deposition gas source 113 for feeding a gas to the proximity to the sample surface, and a manipulator 115 for picking up a microscopic sample.

The ions from the liquid-metal ion source emitter 100 are extracted by the extraction electrode 101, then being focused on the sample 111 by the condenser lens 102 and the objective lens 109. In a blanking operation by the blanker 105, the ion beam is injected into the Faraday cup 107.

The focused ion beam apparatus of the present embodiment is equipped with the deposition gas source 113 and the manipulator 115. This configuration allows a microscopic sample fragment to be extracted out of a local area of the sample by using the micro-sampling method.

Figure 3:
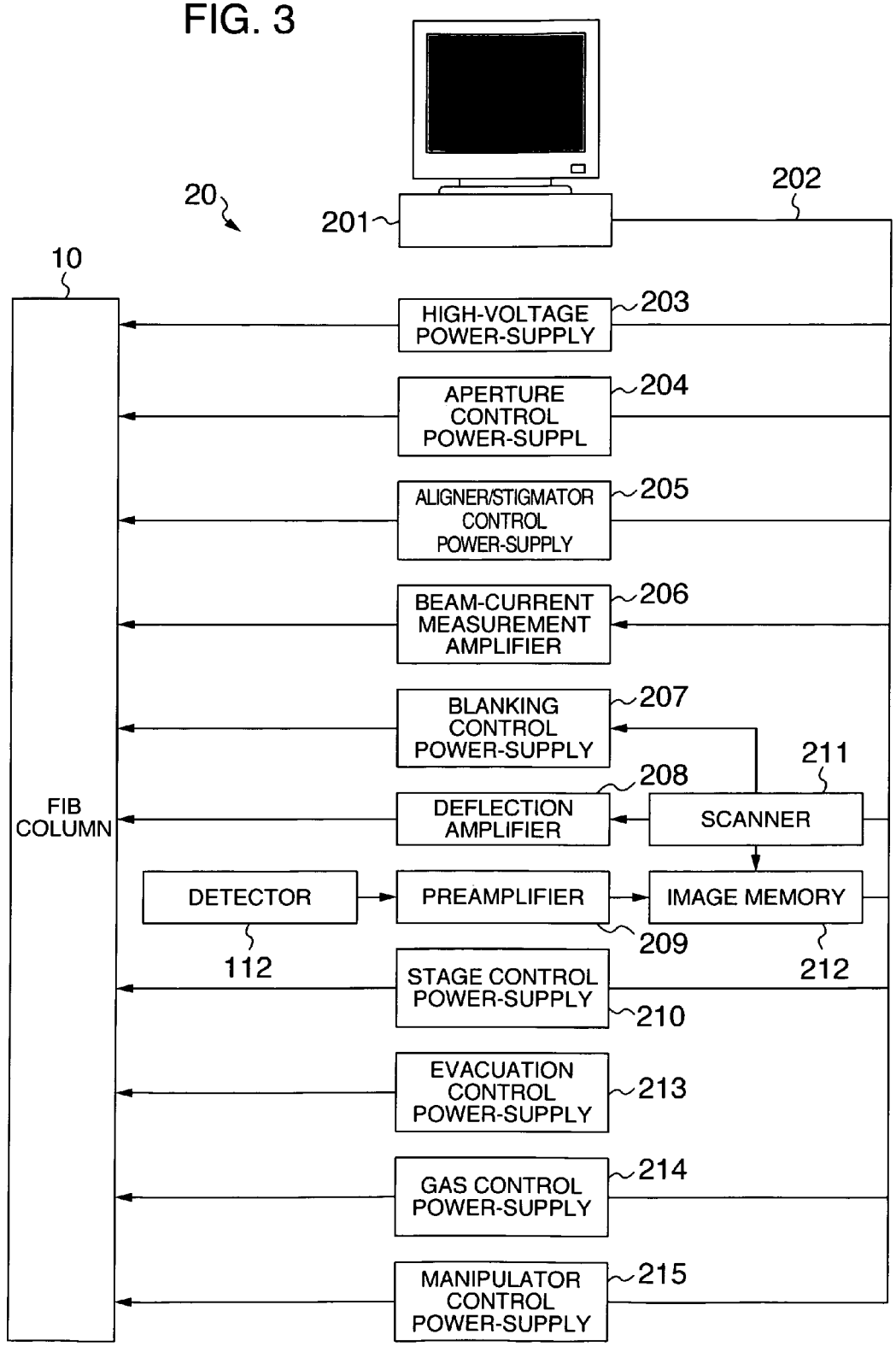
FIG. 3 is a configuration diagram of a control apparatus of the focused ion beam apparatus according to the present invention.

Referring to FIG. 3, the explanation will be given below concerning an embodiment of the control apparatus 20 of the charged particle beam apparatus according to the present invention. The control apparatus 20 includes the following configuration components: A high-voltage power-supply 203, an aperture control power-supply 204, an aligner/stigmator control power-supply 205, a beam-current measurement amplifier 206, a blanking control power-supply 207, a deflection amplifier 208, a preamplifier 209, a stage control power-supply 210, a scanner 211, an image memory 212, an evacuation control power-supply 213, a gas control power-supply 214, and a manipulator control power-supply 215. The respective control power-supplies are controlled in a centralized manner by the computer 201 via a control bus 202.

The high-voltage power-supply 203 applies high voltages to the ion source emitter 100, the extraction electrode 101, the condenser lens 102, and the objective lens 109. The aperture control power-supply 204 controls the variable aperture 103, thereby selecting a desired aperture diameter. A small-diameter aperture is selected at the time of image observation, and a large-diameter aperture is selected when performing a large-area machining. The aligner/stigmator control power-supply 205 controls an octo-pole deflector electrode voltage for the aligner/stigmator 104, thereby performing electrical axis alignment and astigmatic correction. The beam-current measurement amplifier 206 measures the beam current which is flown into the Faraday cup 107 at the time of blanking. The blanking control power-supply 207 drives a blanking electrode of the blanker 105, thereby performing the beam blanking.

The deflection amplifier 208 inputs a scanning signal from the scanner 211, then driving the deflector 108, i.e., an octo-pole and two-stage electrostatic deflector. The preamplifier 209 converts the signal from the detector 112 into a luminance voltage signal, then converting this signal into digital values, and writing the digital values into the image memory 212. An image stored into the image memory 212 is displayed on the display apparatus 42.

The gas control power-supply 214 performs temperature control over the gas source 113 and its valve open/close control. The manipulator control power-supply 215 performs fine-motion control over the manipulator 115, and its touch-detection control with the sample.

FIG. 4 is a diagram for explaining part of a deflection control system and an image generation system of the control apparatus 20 of the charged particle beam apparatus according to the present invention. The scanner 211 includes X-direction and Y-direction 9-bit beam scanning counters 61, 62 and DA converters 69, 70. The digital scanning signals xd, yd from the counters 61, 62 are converted into analogue scanning signals xa, ya by the DA converters 69, 70, then being outputted to the deflection amplifier 208.

The preamplifier 209 includes an AD converter 71 for applying an AD conversion to the analogue secondary-electron signal from the detector 112. The digital secondary-electron signal from the AD converter 71 is stored into the image memory 212 together with the digital scanning signals xd, yd from the counters 61, 62. Setting up synchronization between the image writing and the scanning allows the sample's microscope image to be formed in the image memory 212. In this way, the 512-pixel×512-pixel image turns out to be stored into the image memory 212.

Figure 5:
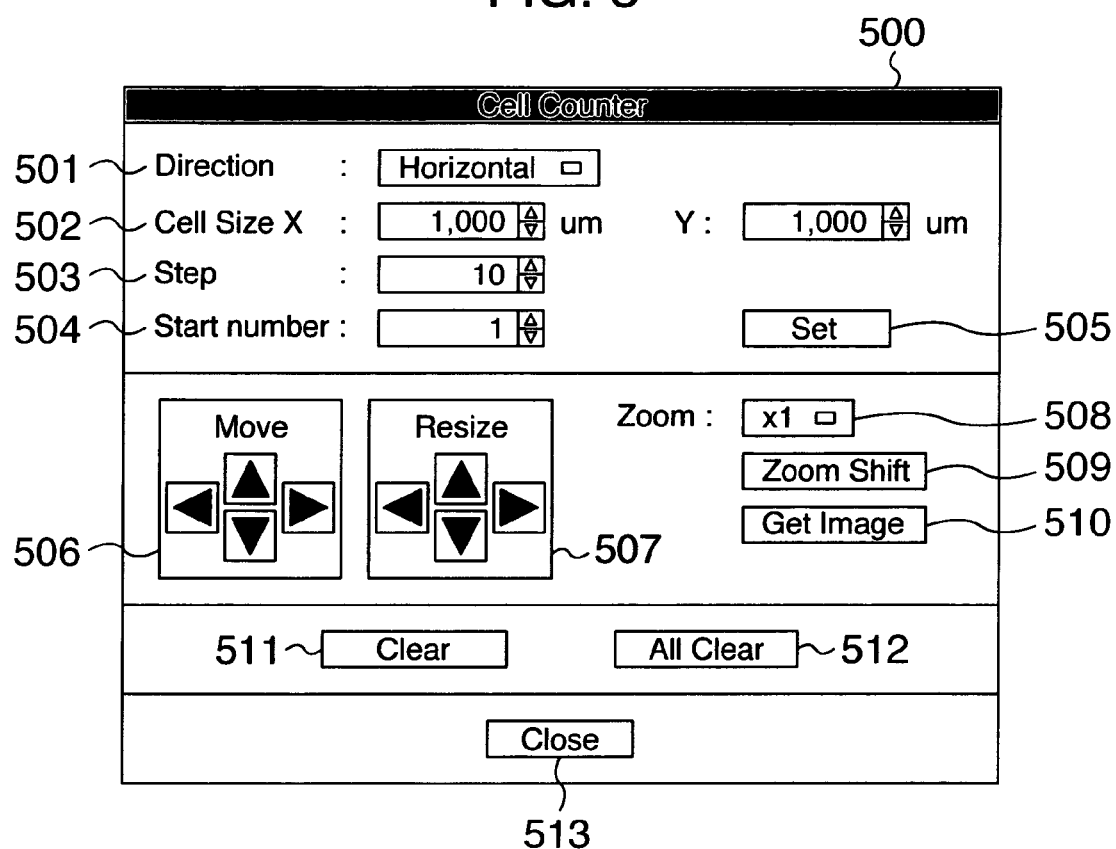
FIG. 5 is a diagram for illustrating an embodiment of an input screen of a display apparatus in the first embodiment of the focused ion beam apparatus according to the present invention.

FIG. 5 illustrates an embodiment of a screen 500 of the display apparatus 42 in the first embodiment of the charged particle beam apparatus according to the present invention. On the upper side of this screen, there are provided a direction selection field 501, a cell-size input field 502, a scale-length specification field 503, a start-cell specification field 504, and a set button 505. The direction selection field 501, which is provided for selecting the direction of a scale to be created, makes it possible to select either the horizontal direction (i.e., Horizontal) or the vertical direction (i.e., Vertical). The cell-size input field 502, which is provided for specifying the size of each of repeated memory cells, makes it possible to input the sizes of each cell in the X and Y directions. The unit for the sizes is μm. The scale-length specification field 503 is provided for specifying the cell number of a scale to be created at one time. The start-cell specification field 504 is provided for specifying the start number of the cell-number value to be written along with the scale. The set button 505 is provided for creating a scale corresponding to the data selected or inputted, and displaying the scale in such a manner that the scale is superimposed on the image of the repeated memory cells.

On the lower side of this screen, there are provided a displacement array button 506, a resize button 507, a zoom selection field 508, an image shift button 509, an image acquisition button 510, a clear button 511, an all-clear button 512, and a close button 513. The displacement array button 506 is provided for performing the position adjustment of a scale created. The resize button 507 is provided for performing the resizing of the scale created.

The zoom selection field 508 is provided for specifying the zoom ratio by a beam deflection function. The image shift button 509 is provided for displacing the image in a software-based manner, i.e., shifting the image in a digital manner without displacing the sample stage. Pressing the image shift button 509 shifts the image in such a manner that the front end of the created scale will be displayed at the end of the displayed image. This permits a scale to be created next to be included within the displayed image. The image acquisition button 510 is provided for newly acquiring the sample image by scanning the beam with the present zoom ratio and the present shift position. Namely, the button 510 is provided for acquiring the sample image by the hardware-based zoom. The clear button 511 is provided for deleting the created scale. The all-clear button 512 is provided for deleting all the created scales. The close button 513 is provided for terminating this screen.

In the present embodiment, although the image display resolution of the screen of the display apparatus 42 is equal to 512×512 pixels, the beam deflection point resolution is equal to 4096×4096 points. Accordingly, it becomes possible to implement the hardware-based zoom which exhibits an eight-time magnification at the maximum. When the zoom ratio is equal to 1, scaling-down the 4096×4096 beam deflection points to the 512×512 pixels requires that the 4096×4096 beam deflection points be thinned out into its one-eighth by the beam deflection function. Meanwhile, when the zoom ratio is equal to 8, the 4096×4096 beam deflection points need not be scaled-down. In substitution therefor, the one-eighth part of the 4096×4096 beam deflection points is used thereby to define and configure the 512×512 pixels.

When the zoom ratio is equal to 8, only the part of the scaled-up image is displayed on the screen of the display apparatus 42. As a result, displaying the other part of the scaled-up image necessitates shifting of the scaled-up image. In the present embodiment, an image is shifted by the image processing, i.e., in a software-based manner. Consequently, displacing the sample stage is unnecessary for shifting the image.

Next, referring to FIG. 6A to FIG. 6D and FIG. 7A to FIG. 7D, the explanation will be given below concerning a method for identifying a cell. Here, the explanation will be given regarding the following case: Namely, defining the upper-left end of repeated cells as a start-point cell, a cell will be identified which is the 20th cell in the horizontal direction and right direction, and also which is the 20th cell in the vertical direction and down direction.

FIG. 6A to FIG. 6D and FIG. 7A to FIG. 7D illustrate examples of the screen of the display apparatus 42. This screen 600 includes an image display area 601, a longitudinal slide bar 602, and a transverse slide bar 603. The image display area 601 displays the image of a sample as the 512-pixel×512-pixel image. The longitudinal slide bar 602 and the transverse slide bar 603 are used for displacing in a software-based manner the image displayed on the image display area 601. The length of each black indicator included in the longitudinal slide bar 602 and the transverse slide bar 603 indicates the zoom ratio. Also, the position of each black indicator indicates at which position of the entire image an area displayed now on the image display area 601 exists. When the zoom ratio is equal to 1, each black indicator has extended along the entire area of each slide bar. Accordingly, when the zoom ratio is equal to 1, the whole area of the sample image is displayed on the image display area 601. Consequently, the sample image at this time cannot be displaced by the longitudinal slide bar 602 and the transverse slide bar 603.

Figure 6A:
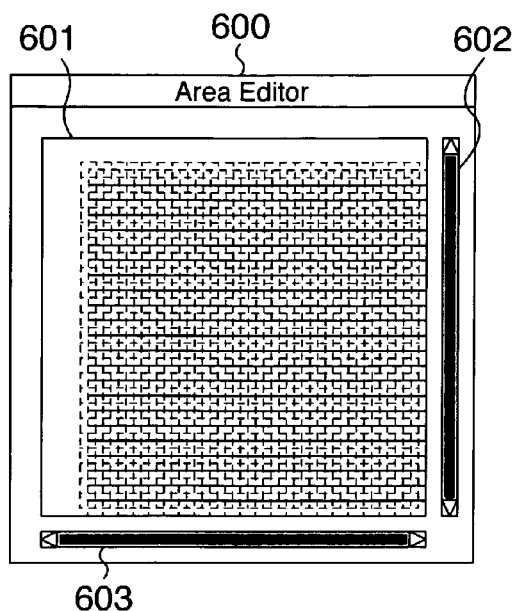
FIG. 6A to FIG. 6D are diagrams for explaining a method for identifying a memory cell and a method for performing a marker machining in the first embodiment of the focused ion beam apparatus according to the present invention.
Figure 6B:
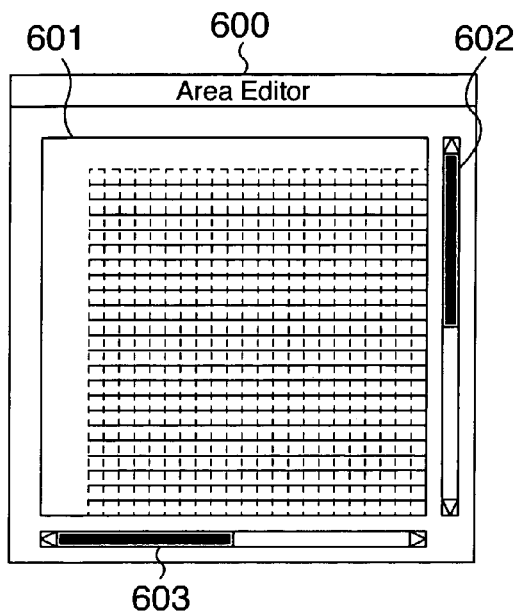
Figure 6C:
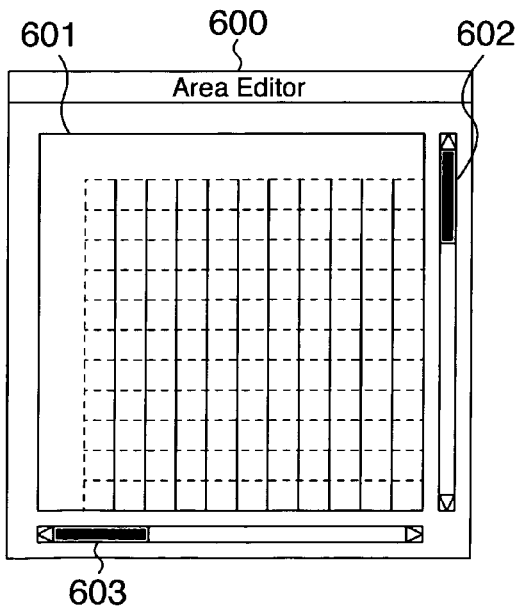

The image display area 601 in FIG. 6A displays the image of the repeated cells whose zoom ratio is equal to 1. This is a case of selecting the zoom ratio as being 1 in the zoom selection field 508, and pressing the image acquisition button 510. Each black indicator has extended along the entire area of each slide bar. The image display area 601 in FIG. 6B displays the image of the repeated cells whose zoom ratio is equal to 2. This is a case of selecting the zoom ratio as being 2 in the zoom selection field 508. The image whose zoom ratio is equal to 2 is acquired in a software-based manner. Each black indicator has extended along the one-half area of each slide bar. Displacing each black indicator makes it possible to shift the image in the up-and-down and right-to-left directions. The image display area 601 in FIG. 6C displays the image of the repeated cells whose zoom ratio is equal to 4. This is a case of selecting the zoom ratio as being 4 in the zoom selection field 508. The image whose zoom ratio is equal to 4 is acquired in a software-based manner. Each black indicator has extended along the one-fourth area of each slide bar. Displacing each black indicator makes it possible to shift the image in the up-and-down and right-to-left directions. In the image which is scaled-up to the four-time magnification in a software-based manner, the outline of each of the repeated cells is not clear. Next, pressing the image acquisition button 510 makes it possible to acquire the image illustrated in FIG. 6D. Pressing the image acquisition button 510 results in the execution of the hardware-based zoom, i.e., the zoom by the beam deflection function. Consequently, the image of each cell illustrated in FIG. 6D is clearer than that of each cell illustrated in FIG. 6C.

Figure 6D:
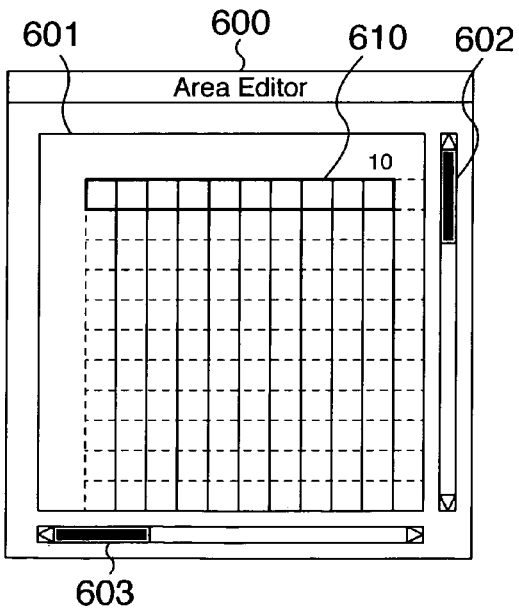

The image display area 601 in FIG. 6D displays a state where a first scale 610 is superimposed on the image of the repeated cells whose zoom ratio is equal to 4. Here, the image display area 601 displays a case of selecting the horizontal direction in the direction selection field 501, inputting the cell size of 1 μm 1 μm in the cell-size input field 502, inputting 10, i.e., the number of the cells as the scale length, in the scale-length specification field 503, inputting 1, i.e., the 1st cell, in the start-cell specification field 504, and pressing the set button 505.

The scale 610 has a configuration that 10 units of 1-μm-longitudinal×1-μm-transverse squares are arranged in line. Each of the squares is the same as each of the repeated cells in configuration. At first, this scale 610 is not matched to the outline of the repeated cells. Namely, the size and position of the scale 610 are displayed in a manner of differing from the size and position of the repeated cells. Operating the displacement array button 506 performs the position alignment, and operating the resize button 507 performs the size alignment. Performing the position alignment and the size alignment in this way allows the scale 610 to be matched to the repeated cells as is illustrated in FIG. 6D. The start end square of the scale 610 is located in a manner of being matched to the upper-left end cell of the repeated cells. On the right end square of the scale 610, "10", i.e., the number of the counted cells as the scale length, is displayed.

Figure 7A:
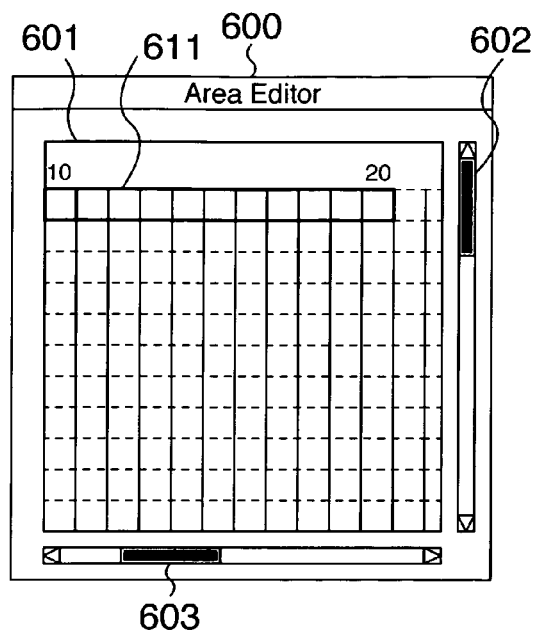
FIG. 7A to FIG. 7D are diagrams for explaining the method for identifying a memory cell and the method for performing the marker machining in the first embodiment of the focused ion beam apparatus according to the present invention.

FIG. 7A illustrates a state where a next scale 611 is displayed in such a manner that the next scale 611 extends from the 10th square of the scale 610. The scanning-ion-microscope image is shifted in the horizontal direction so that the 10th square of the scale 610 is located at the upper-left end of the image display area 601. Although shifting the image is implemented by pressing the image shift button 509, it may also be implemented by operating the transverse slide bar 603. On the right end square of the scale 611, "20", i.e., the number of the counted cells, is displayed. This shows that the twenty cells have been counted in the horizontal direction.

Figure 7B:
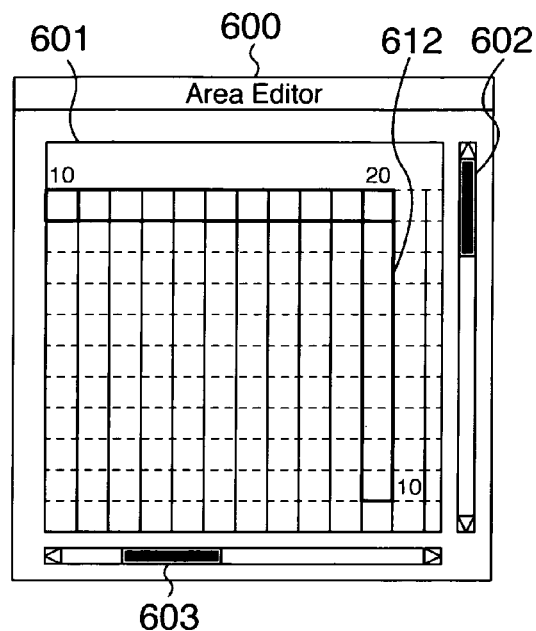

FIG. 7B illustrates a state where a scale 612 in the longitudinal direction is displayed in such a manner that the scale 612 extends from the 20th square of the scale 611. Here, the image display area 601 displays a case of selecting the longitudinal direction in the direction selection field 501, inputting the cell size of 1 μm×1 μm in the cell-size input field 502, inputting 10, i.e., the number of the cells as the scale length, in the scale-length specification field 503, inputting 10, i.e., the 10th cell, in the start-cell specification field 504, and pressing the set button 505. At the right of the lower end square of the scale 612, "10", i.e., the number of the counted cells specified in the start-cell specification field 504, is displayed.

Figure 7C:
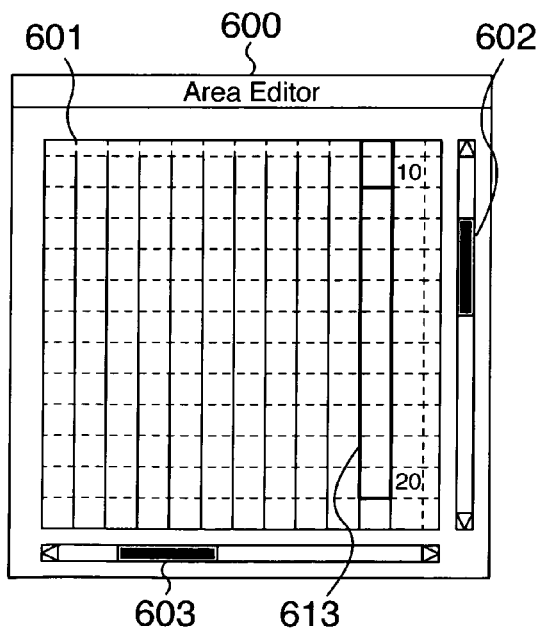

FIG. 7C illustrates a state where a next scale 613 is displayed in such a manner that the next scale 613 extends from the 10th square of the scale 612. The scanning-ion-microscope image is shifted in the longitudinal direction so that the 10th square of the scale 612 is located at the upper-right end of the image display area 601. Although shifting the image is implemented by pressing the image shift button 509, it may also be implemented by operating the longitudinal slide bar 602. At the right of the lower end square of the scale 613, "20", i.e., the number of the counted cells, is displayed. This shows that the twenty cells have been counted in the longitudinal direction. In this way, the cell existing at the above-described destination position (20, 20) is attained and reached.

Figure 7D:
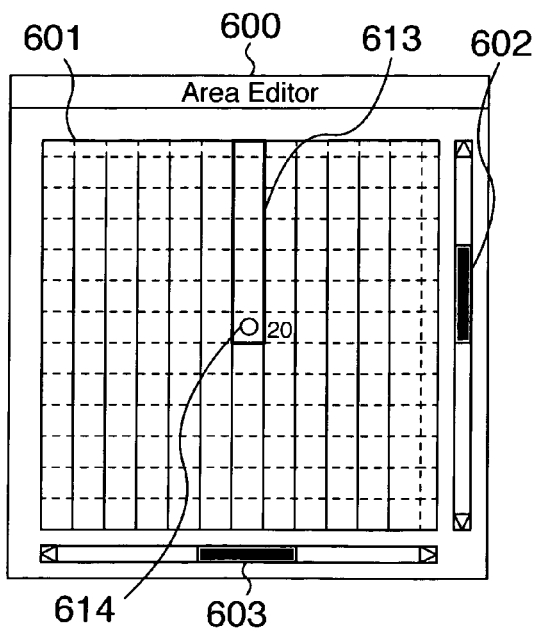

FIG. 7D illustrates a state where the scanning-ion-microscope image is shifted so that the cell existing at the destination position (20, 20) is located at the center of the image display area 601. Shifting the image is executed in a software-based manner, i.e., without displacing the sample stage. A circle-shaped mark pattern 614 is displayed on the square of the destination position (20, 20). This mark pattern 614 makes it possible to visually recognize the position of the destination cell.

The scales 610, 611, 612, and 613 and the mark pattern 614 are just geometrical graphics formed on the screen, and thus are not physically formed on the sample surface by using the scanning ion beam. As a consequence, in the present embodiment, it becomes possible to identify the destination cell with no damage caused onto the sample surface.

Figure 8:
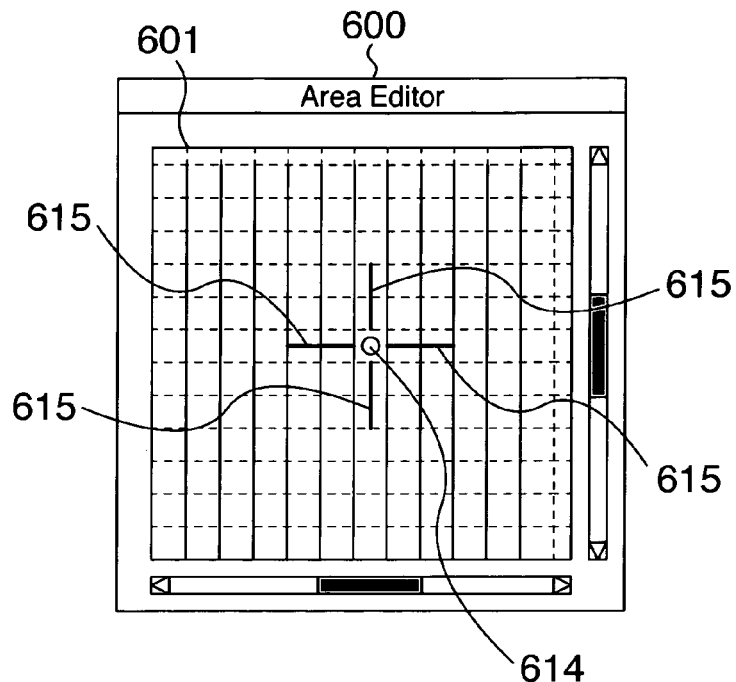
FIG. 8 is a diagram for explaining the method for identifying a memory cell and the method for performing the marker machining in the first embodiment of the focused ion beam apparatus according to the present invention.

FIG. 8 illustrates a state where a cross-shaped marker 615 is formed in the surroundings of the destination cell. Forming the marker 615 in this way allows the destination cell to be easily identified when observing this sample by using some other observation apparatus. The machining of the marker 615 may be a removal machining which takes advantage of the sputtering phenomenon based on a local irradiation with the focused ion beam. The machining of the marker 615 may also be a machining which takes advantage of focused-ion-beam-assisted deposition or focused-ion-beam-assisted etching in a gas atmosphere. Also, it can be assumed that the cell around which the marker 615 is formed will be analyzed by being subjected to a sampling. Consequently, a focused-ion-beam-assisted deposition film may be formed as a protection film on the upper portion of this cell. Also, it is possible to divert this protection film itself as the mark.

Figure 9:
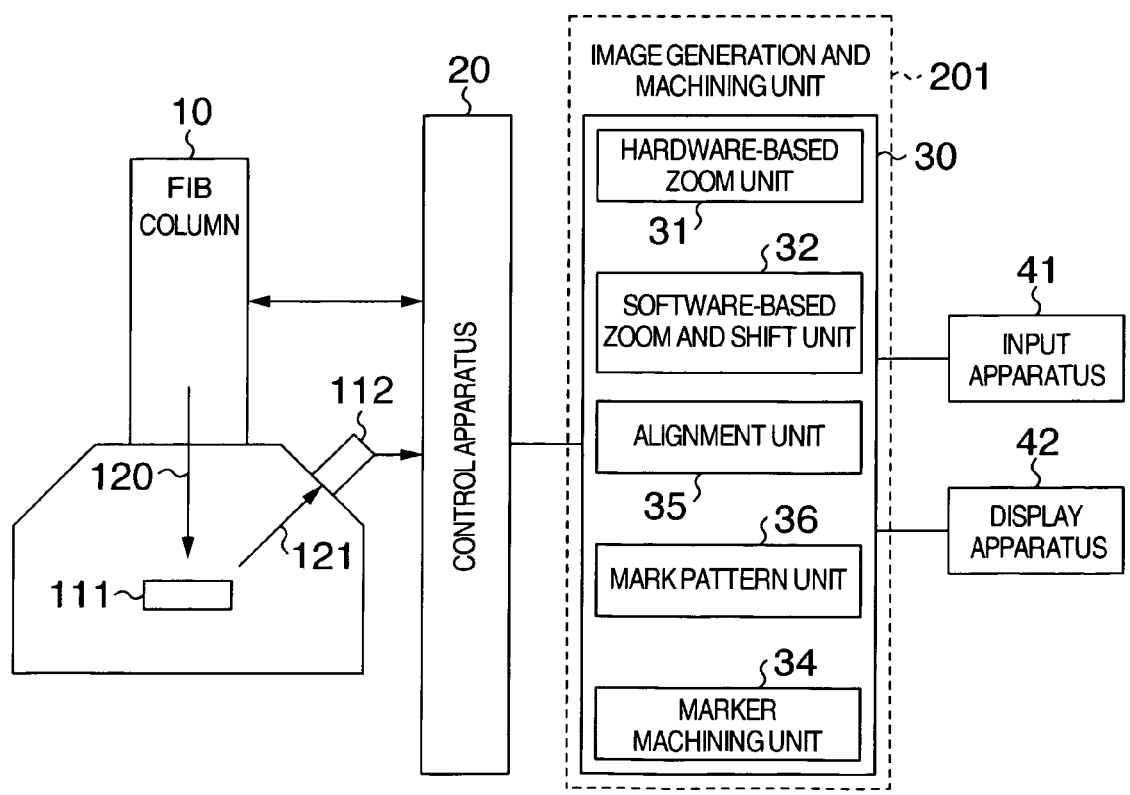
FIG. 9 is a diagram for illustrating a second embodiment of the charged particle beam apparatus according to the present invention.

FIG. 9 is a diagram for illustrating a second embodiment of the charged particle beam apparatus according to the present invention. The charged particle beam apparatus of the present embodiment is a focused ion beam apparatus. In comparison with the first embodiment in FIG. 1, the focused ion beam apparatus of the present embodiment differs therefrom in the image generation and machining unit 30. The image generation and machining unit 30 of the present embodiment includes the hardware-based zoom unit 31 for performing the hardware-based zoom, the software-based zoom and shift unit 32 for performing the software-based zoom and the software-based shift, an alignment unit 35 for performing an alignment between virtually set disposition information on the cells and the scanning-ion-microscope image, and a mark pattern unit 36 for performing the generation and display of the mark pattern, and the marker machining unit 34 for machining the marker on the sample 111. In order to implement the software-based zoom and the software-based shift, the beam deflection point resolution is larger than the image display resolution. In the present embodiment, the beam deflection point resolution is equal to 4096×4096 points, and the image display resolution is equal to 512×512 pixels. Accordingly, it becomes possible to implement the software-based zoom which exhibits an eight-time magnification at the maximum.

Figure 10:
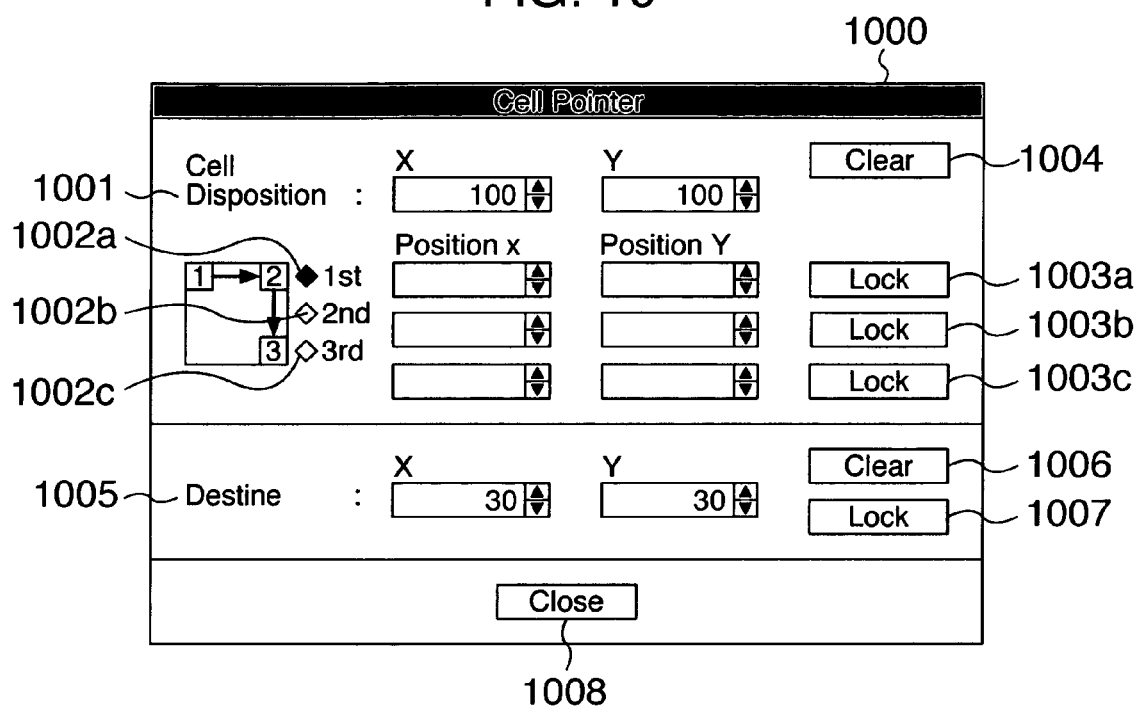
FIG. 10 is a diagram for illustrating an embodiment of the input screen of the display apparatus in the first embodiment of the focused ion beam apparatus according to the present invention.

FIG. 10 illustrates an embodiment of a screen 1000 of the display apparatus 42 in the second embodiment of the charged particle beam apparatus according to the present invention. On the upper side of this screen, there are provided a cell-disposition input field 1001, first to third alignment-position input fields 1002*a* to 1002*c*, and three lock buttons 1003*a* to 1003*c*, and a clear button 1004.

The cell-disposition input field 1001 is provided for inputting the disposition number of the cells which belong to the sample. The first to third alignment-position input fields 1002*a* to 1002*c* are provided for inputting three positions for the alignment. The three lock buttons 1003*a* to 1003*c* are provided for registering the input values into the first to third alignment-position input fields 1002*a* to 1002*c*. The clear button 1004 is provided for clearing the input values. The cell-disposition number is inputted into the cell-disposition input field 1001, and the three alignment positions are inputted into the first to third alignment-position input fields 1002*a* to 1002*c*, then pressing the lock buttons 1003*a* to 1003*c*. This operation causes the alignment to be performed at the three alignment positions.

On the lower side of this screen, there are provided a destination-cell coordinate input field 1005, a clear button 1006, a mark button 1007, and a close button 1008. The destination-cell coordinate input field 1005 is provided for inputting the coordinate of a destination cell. The clear button 1006 is provided for clearing the input value. The mark button 1007 is provided for generating the mark pattern in the surroundings of the destination cell. After the alignment at the three alignment positions has been terminated, the coordinate of the destination cell is inputted into the destination-cell coordinate input field 1005, then pressing the mark button 1007. This operation causes the mark pattern to be displayed in the surroundings of the destination cell.

Next, referring to FIG. 11A to FIG. 11D, the explanation will be given below concerning a method for identifying a cell. Here, the explanation will be given regarding the following case: Namely, defining the upper-left end of repeated cells as a start-point cell, a cell will be identified which is the 30th cell in the horizontal direction and right direction, and also which is the 30th cell in the vertical direction and down direction. It is assumed that the number of the repeated cells has been already known, and that all the cells exist within the beam deflection area. Namely, it is assumed that all the cells can be irradiated with the beam without displacing the sample stage. In recent years, there has been a significant increase in the storage capacity of such apparatuses as the semiconductor memory. The memory cells, however, are partitioned with a minimum unit which is referred to as "mat". In accompaniment with the fine miniaturization of the semiconductor memory devices, this mat has been becoming a size which permits the mat to be easily included within the beam deflection area.

FIG. 11A to FIG. 11D illustrate examples of the screen of the display apparatus 42. This screen 1100 includes an image display area 1101, a longitudinal slide bar 1102, and a transverse slide bar 1103. The image display area 1101 displays the image of a sample as the 512-pixel×512-pixel image. As is the case with FIG. 6C, the image display area 1101 displays the image of the repeated cells whose zoom ratio is equal to 4. Each black indicator has extended along the one-fourth area of each slide bar. Displacing each black indicator makes it possible to shift the image in the up-and-down and right-to-left directions.

Figure 11A:
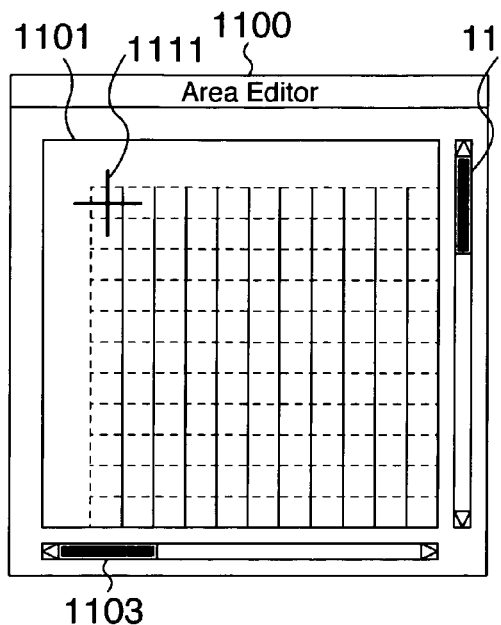
FIG. 11A to FIG. 11D are diagrams for explaining the method for identifying a memory cell and the method for performing the marker machining in a second embodiment of the focused ion beam apparatus according to the present invention.
Figure 11B:
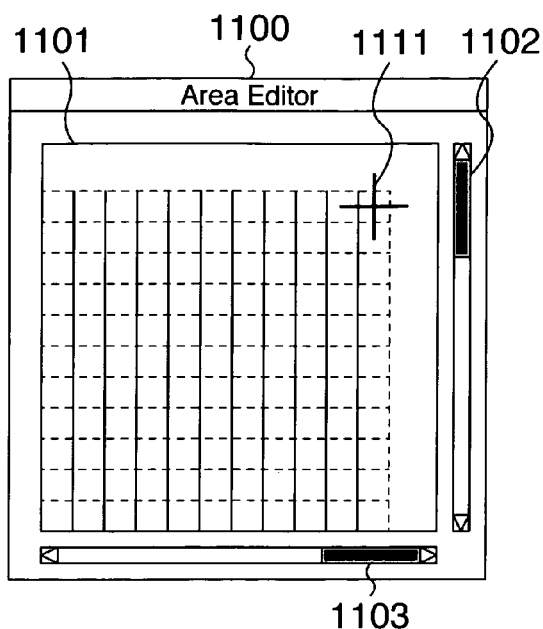
Figure 11C:
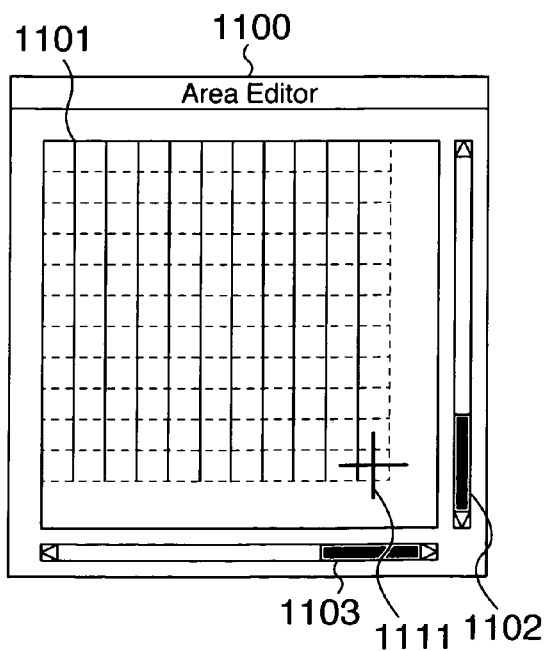

FIG. 11A illustrates a case of inputting the cell-disposition number 100×100 in the cell-disposition input field 1001, and inputting a first position (1, 1) of the cells in the first alignment-position input field 1002a. The first position (1, 1) of the cells is located at the upper-left end of the image display area 1101, and a cursor 1111 is displayed there. FIG. 11B illustrates a case of inputting a second position (1, 30) of the cells in the second alignment-position input field 1002b. The second position (1, 30) of the cells is located at the upper-right end of the image display area 1101, and the cursor 1111 is displayed there. FIG. 11C illustrates a case of inputting a third position (30, 30) of the cells in the third alignment-position input field 1002c. The third position (30, 30) of the cells is the position of the destination cell. The destination cell is located at the lower-right end of the image display area 1101, and the cursor 1111 is displayed there.

In this way, in the present embodiment, the upper-left end of the cells is set as the first position. Next, the position resulting from displacing the first position in the right direction by the amount of the X coordinate of the destination cell is set as the second position. Moreover, the position resulting from displacing the second position in the down direction by the amount of Y coordinate of the destination cell is set as the third position. As a result of this operation, the third position becomes the position of the destination cell. The image generation and machining unit 30 identifies the destination cell on the virtual cell disposition.

Figure 11D:
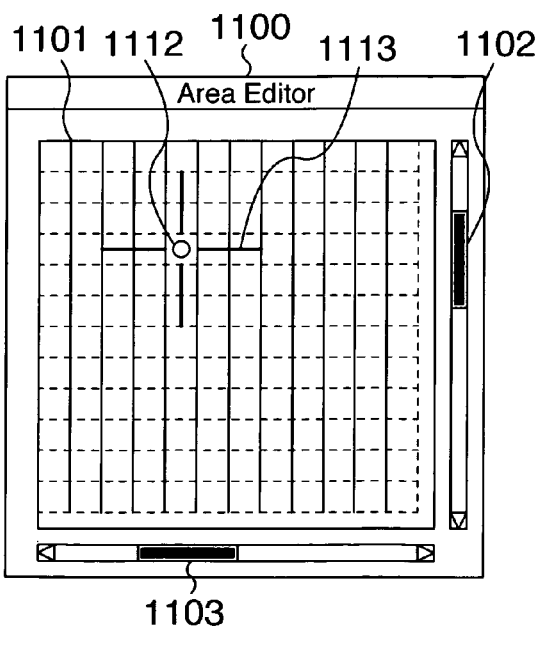

FIG. 11D illustrates a state where a circle-shaped mark pattern 1112 is displayed on the position (30, 30) of the destination cell. This is a case of inputting the position (30, 30) of the destination cell into the destination-cell coordinate input field 1005. On the virtual cell disposition, the mark pattern 1112 is displayed on the position (30, 30) of the destination cell.

Pressing the mark button 1007 causes a marker 1113 to be generated in the surroundings of the destination cell. As described earlier, the machining of the marker 615 may be the removal machining which takes advantage of the sputtering phenomenon based on the local irradiation with the focused ion beam.

In the present embodiment, the coordinate of the destination cell has been specified on the screen 1000 in FIG. 10. It is also possible, however, that information such as file bit map is acquired from a defect inspection system, and the coordinate of the destination cell is extracted out of this information so as to be manipulated and taken advantage of.

Figure 12:
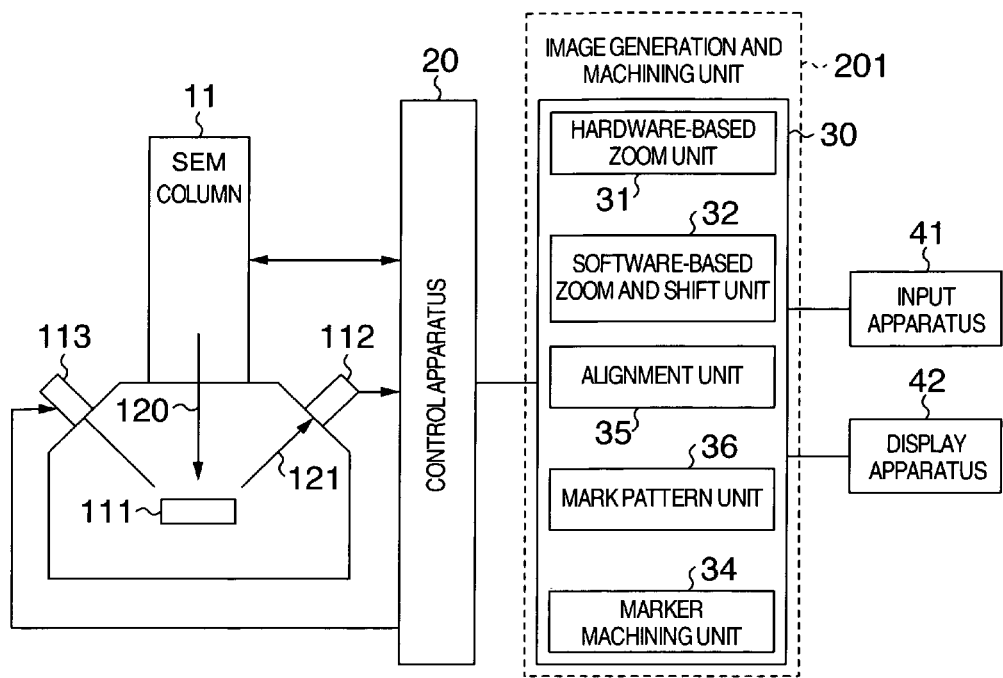
FIG. 12 is a diagram for illustrating a third embodiment of the charged particle beam apparatus according to the present invention.

FIG. 12 is a diagram for illustrating a third embodiment of the charged particle beam apparatus according to the present invention. The charged particle beam apparatus of the present embodiment includes a SEM column 11 for generating a focused electron beam 120 so as to irradiate the sample 111 with the focused electron beam 120. In comparison with the first and second embodiments illustrated in FIG. 1 and FIG. 9 respectively, the present embodiment differs therefrom in the point that the electron beam is used as the charged particle beam. In the case of the electron beam, the execution of even a long-time irradiation with the electron beam causes no damage onto the surface of the sample 111. When performing the marker machining on the sample surface by using the electron beam, a contamination may be deposited thereon by performing the long-time electron beam irradiation onto a local area thereof within an atmosphere whose vacuum level is comparatively low. In the present embodiment, however, a protection film has been formed on the sample surface by feeding a tungsten hexa carbonyl gas thereto from the deposition gas source 113. Then, this protection film has been irradiated with the focused electron beam, thereby forming the marker. The control over the gas source 113 has been performed from a deposition control unit inside the control apparatus.

Figure 13:
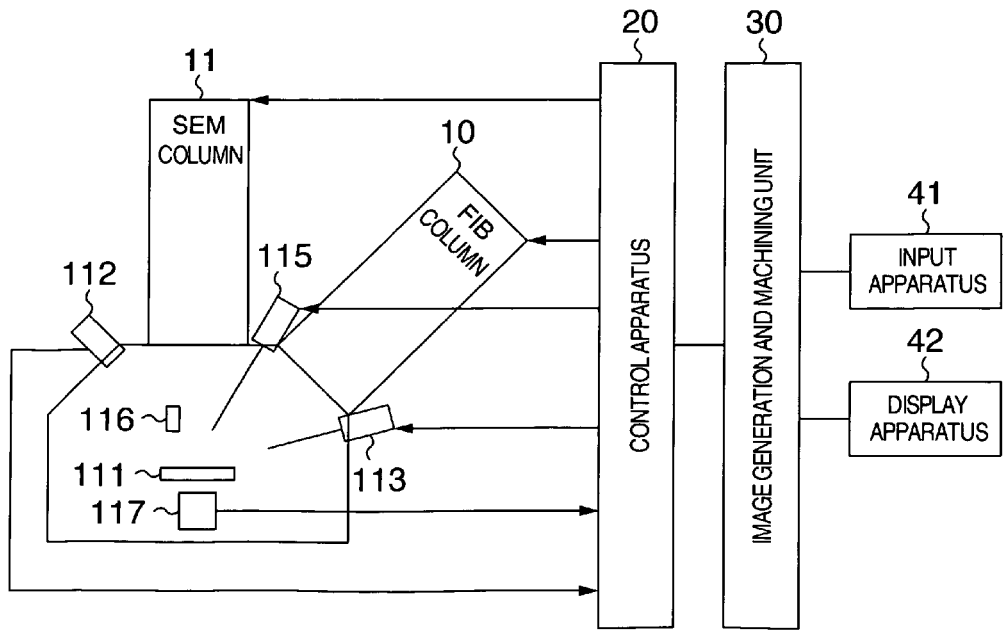
FIG. 13 is a diagram for illustrating a fourth embodiment of the charged particle beam apparatus according to the present invention.

FIG. 13 is a diagram for illustrating a fourth embodiment of the charged particle beam apparatus according to the present invention. The charged particle beam apparatus of the present embodiment includes the FIB column 10 for generating the focused ion beam so as to irradiate the sample 111 with the focused ion beam, and the SEM column 11 for generating the electron beam so as to irradiate the sample 111 with the electron beam. In the present embodiment, either or both of the focused ion beam and the electron beam will be used.

Figure 14:
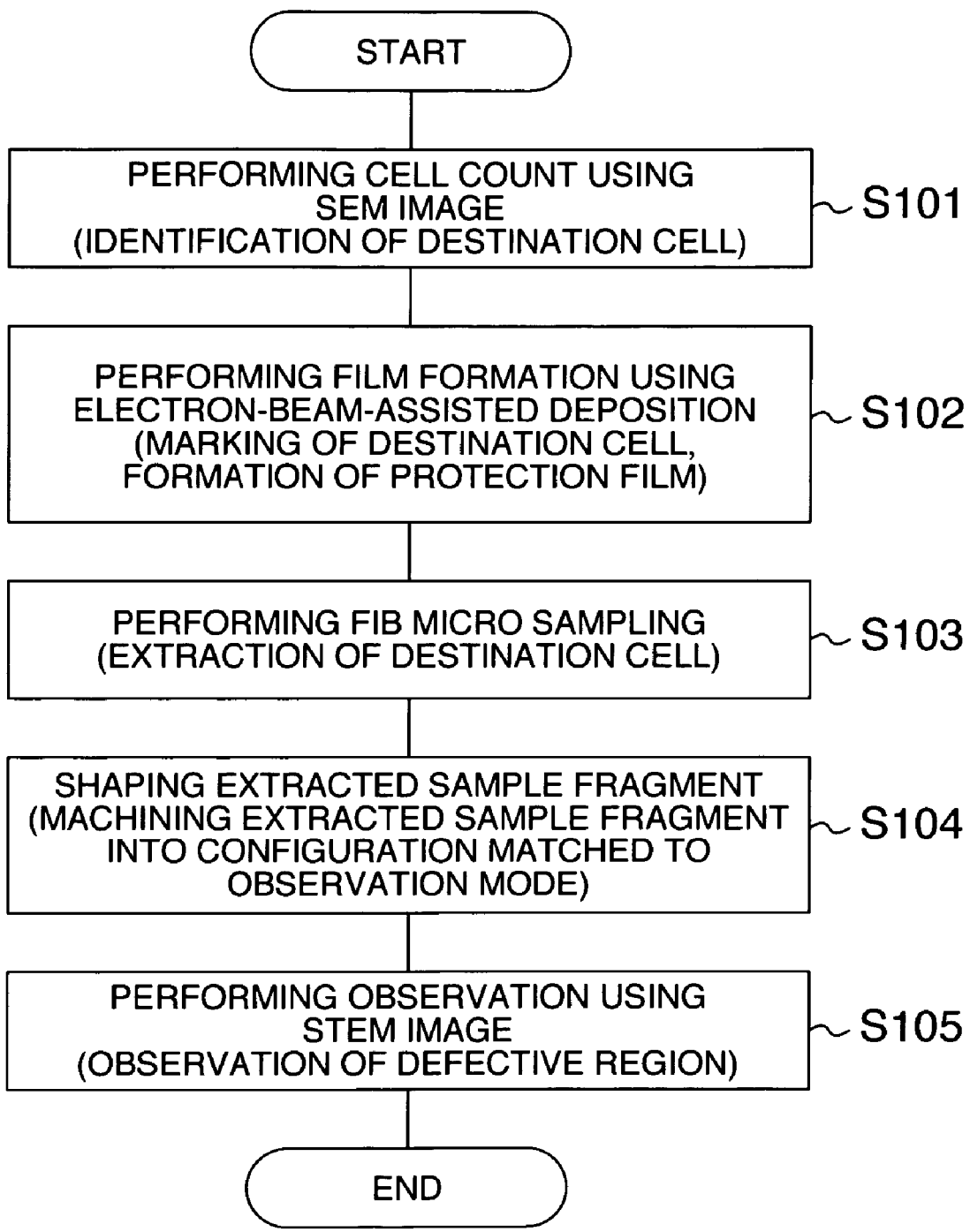
FIG. 14 is a diagram for illustrating a flow of the processing in the fourth embodiment of the charged particle beam apparatus according to the present invention.

Next, referring to FIG. 14 and using the fourth embodiment of the charged particle beam apparatus according to the present invention, the explanation will be given below concerning a method for identifying a cell located at a predetermined position, and performing the sampling of this cell. At a step S101, the cell count is performed using the scanning-electron-microscope (: SEM) image, thereby performing the identification of a destination cell. The processing at the step S101 is basically the same as the first and second embodiments illustrated in FIG. 1 and FIG. 9 respectively. At a step S102, the surface of the sample 111 is irradiated with the electron beam while feeding a gas thereto from the deposition gas source 113. This processing forms a protection film on the destination cell. In the present embodiment, this protection film has a function as the marker for identifying the destination cell. At a step S103, a microscopic sample fragment including the destination cell is extracted based on the micro-sampling method using the focused ion beam. The sample 111 is taken out of a sample chamber, then introducing a carrier 116 into the sample chamber and locating the carrier 116 on the beam's optical axis. The microscopic sample fragment is fixed on this carrier 116 via the deposition film. At a step S104, a thin-film machining of the microscopic sample fragment bonded to the carrier 116 is performed using the focused ion beam. The carrier 116 is tilted so that the electron beam will pass through this resultant thin-film fragment in a manner of being perpendicular thereto. At a step S105, the electron beam is scanned on the thin-film fragment, and the electron beam which has passed through the thin-film fragment is detected by a STEM detector 117. From the output of the STEM detector 117, the scanning-transmission-electron-microscope (: STEM) image of the sample fragment is acquired. This STEM image permits acquisition of defect information within the destination memory cell.

In the charged particle beam apparatus of the present embodiment, there are simultaneously provided a large-sized sample targeted stage usually used in the SEM and a sideentry stage usually used in the TEM. Also, the STEM detector 117 is provided within the large-sized sample targeted stage. According to the present embodiment, the electron beam is taken advantage of. This feature allows implementation of the cell count which causes little damage to the sample, and also makes it possible to form the protection film on the upper portion of the destination cell (This is effective when the defect exists in the proximity to the sample surface). Also, there are simultaneously provided the FIB column 10, the deposition gas source 113, the manipulator 115, and the STEM detector 117. As a result, it becomes possible to carry out the micro sampling inside one and the same sample chamber. This feature allows implementation of the high space-resolution STEM observation after the thin-film machining. Consequently, it becomes possible to perform at a high speed the operations ranging from the defect's position search to the high-resolution observation without exposing the sample to the atmosphere.

In the present embodiment, the use of the FIB column 10, the deposition gas source 113, and the manipulator 115 allows implementation of the micro sampling. It is self-evident, however, that the use of the manipulator 115 allows implementation of the sampling of the microscopic area including the identified cell in the first and second embodiments of the charged particle beam apparatus as well. In this case, there exists an advantage of being capable of performing at a high speed the operations ranging from the defect's position search to the sampling with the use of the single apparatus.

Figure 15:
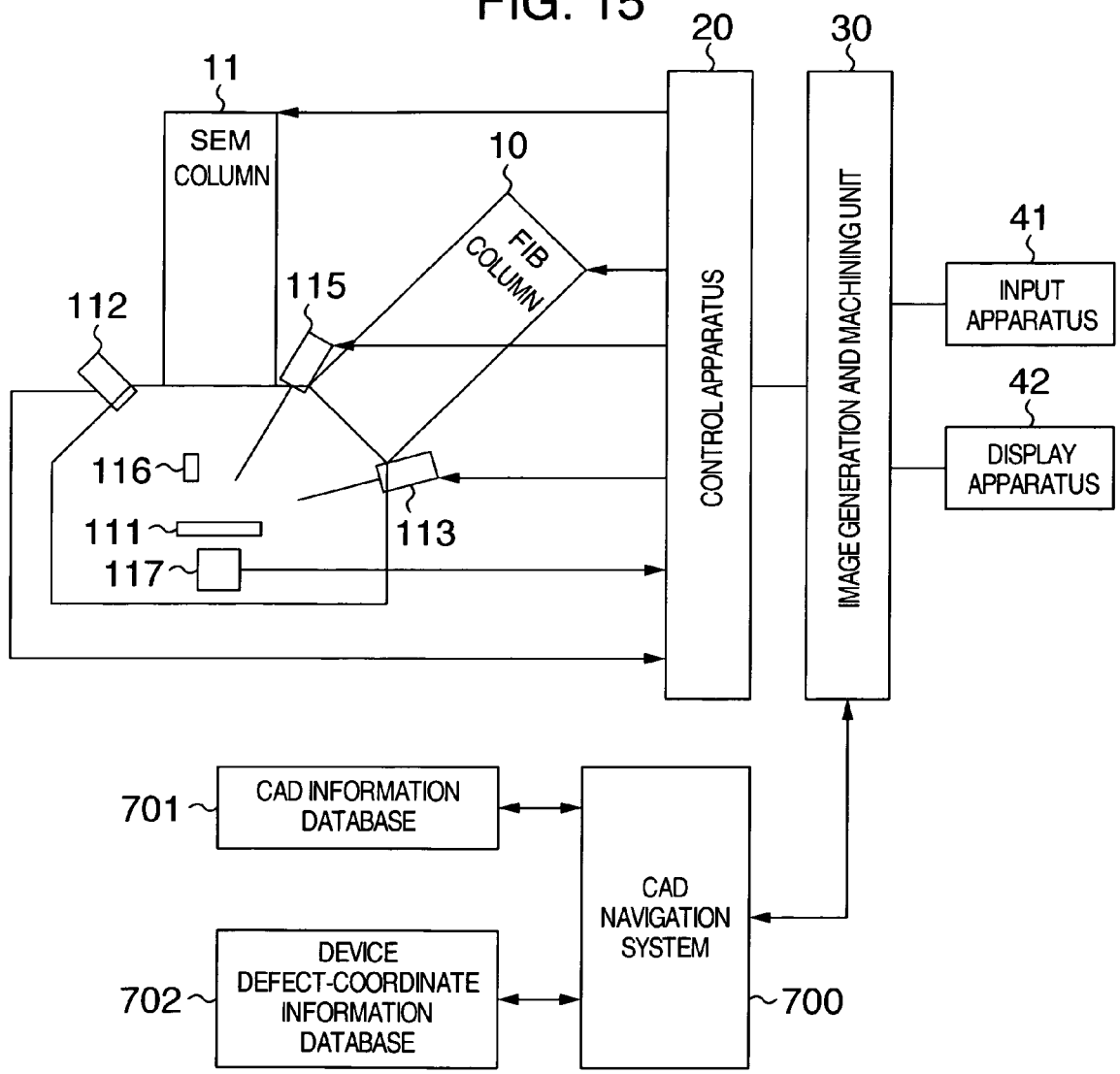
FIG. 15 is a diagram for illustrating a fifth embodiment of the charged particle beam apparatus according to the present invention.

FIG. 15 illustrates a fifth embodiment of the charged particle beam apparatus according to the present invention. The present embodiment results from connecting a CAD navigation system 700 for performing the CAD navigation to the charged particle beam apparatus of the fourth embodiment illustrated in FIG. 13. The CAD navigation system 700 is connected to a CAD information database 701 for storing the CAD information and a device defect-coordinate information database 702 for storing the device defect-coordinate information. The device defect-coordinate information is defect-coordinate information such as fail bit map. The general utilization methodology for the CAD navigation is as follows:

(1) The sample is introduced into the charged particle beam apparatus.

(2) By displacing the sample stage, an alignment is performed between feature points (usually, three points positioned away from each other) of the sample and the CAD layout information.

(3) A destination location (e.g., a specific cell) is specified on the CAD layout.

(4) The sample stage is displaced to the specified place, thereby identifying the destination location.

According to this methodology, it is required to displace the sample stage. Accordingly, mechanical positioning accuracy of the sample stage determines specified accuracy of the destination location. If the sample pattern has a feature, and thus if a fine adjustment can be performed when the CAD layout pattern is superimposed on the sample pattern, it is possible to correct error amount of the stage displacement to some extent by making the visual inspection. In repeated patterns such as the memory cells, however, this type of correction is difficult to perform. Consequently, it has been long considered that identifying a memory cell absolutely necessitates the employment of a sample stage having an exceedingly high position accuracy.

In the present embodiment, the alignment method of the second embodiment according to the present invention illustrated in FIG. 9 is applied to the CAD navigation system 700. Namely, using a digital zoom-up and shift function, the alignment is performed between the CAD layout information and a sample image within the beam deflection area. In this away, the detailed CAD navigation within the beam deflection area has been made possible without displacing the sample stage.

Figure 16A:
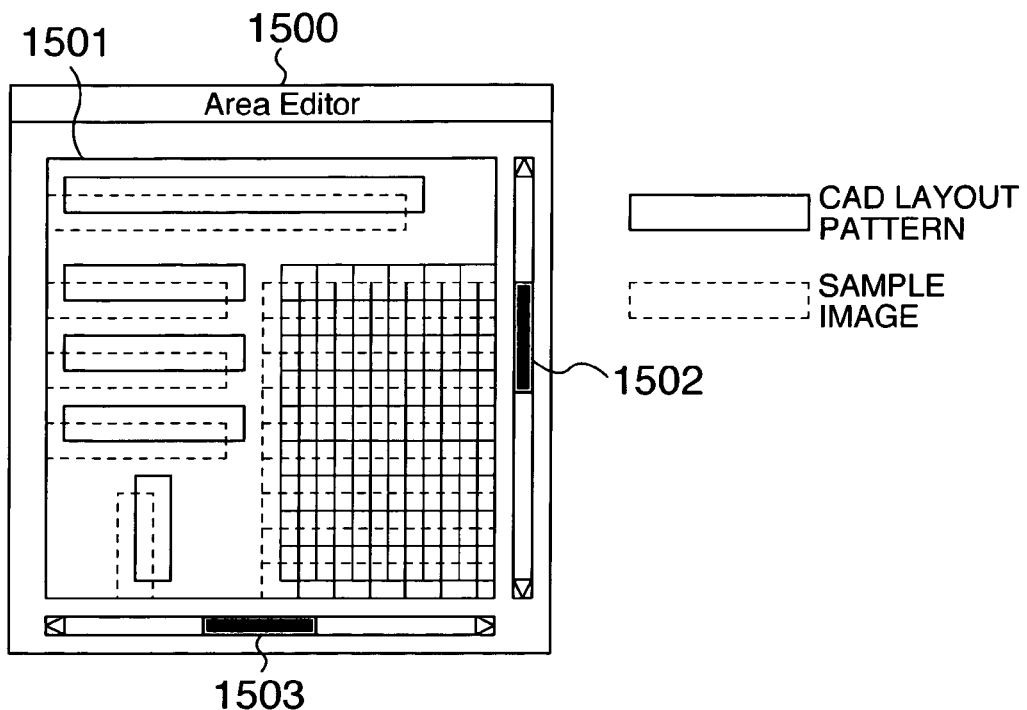
FIG. 16A and FIG. 16B are diagrams for illustrating a flow of the CAD navigation processing in the fifth embodiment of the charged particle beam apparatus according to the present invention.
Figure 16B:
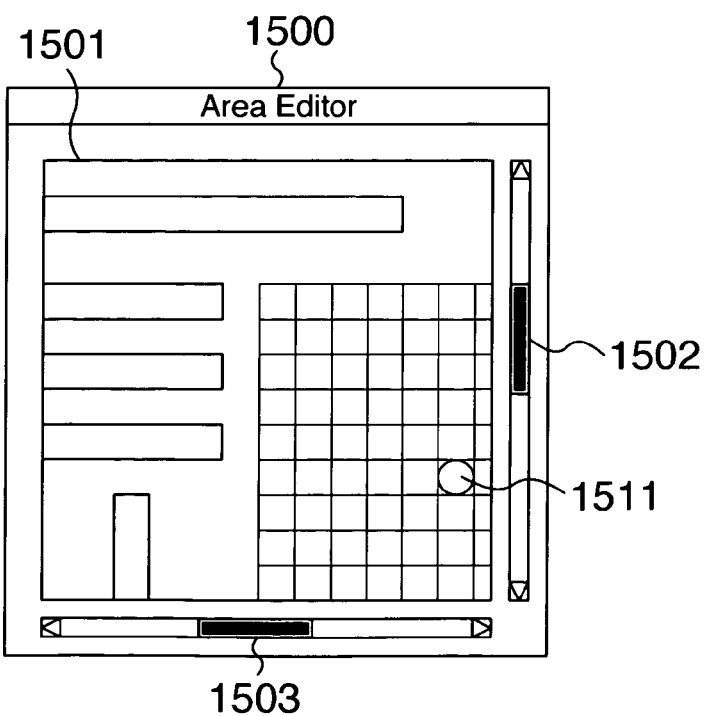

Next, referring to FIG. 16A and FIG. 16B, the explanation will be given below concerning a method of the present embodiment. FIG. 16A and FIG. 16B illustrate examples of the screen of the display apparatus. This screen 1500 includes an image display area 1501, a longitudinal slide bar 1502, and a transverse slide bar 1503. The image display area 1501 displays the image of a sample as the 512-pixel×512-pixel image. The image display area 1501 in FIG. 16A displays CAD layout patterns and sample images before the alignment. Before the alignment, the CAD layout patterns in solid lines and the sample images in dashed lines deviate from each other. The image display area 1501 in FIG. 16B displays the CAD layout patterns and the sample images after the alignment. After the alignment, the CAD layout patterns and the sample images are located in a manner of being matched to each other. Namely, the CAD layout patterns are superimposed on the sample images in a manner of being matched thereto. After the alignment, the CAD layout patterns and the sample images displace in a state of being overlapped with each other. The CAD navigation system 700 extracts the memory-cell coordinate of a defect from the device defect-coordinate information database 702, then displaying a mark pattern 1511 for the defect on the CAD layout patterns. Accordingly, identifying the destination cell (in this case, the defective cell) can be carried out with a high accuracy. In the present embodiment, the explanation has been given concerning the identification of a cell. It is self-evident, however, that the methodology taking advantage of the CAD navigation system allows not only the search for a cell, but also the search for a general destination location.

According to the present invention, the cell count, which is effective for the failure analysis of a semiconductor in particular, can be carried out with a high accuracy and at a high speed. The mechanical movement of the stage displacement is unnecessary during the cell count. This feature makes it possible to ensure the high position accuracy, and thus makes it possible to ensure the high count accuracy. Since the high stage-displacement accuracy is unnecessary, there exists an advantage of being capable of implement the functions at a low cost.

So far, the explanation has been given concerning the above-described embodiments of the present invention. It will be understood by those who are skilled in the art, however, that the present invention is not limited to these embodiments, and that the various modifications can be made within the scope of the present invention disclosed in the following appended claims.

The invention claimed is:

1. A charged particle beam apparatus, comprising:
   an irradiation system for irradiating a sample with a charged particle beam,
   a deflection control system for deflecting said charged particle beam,
   a detector for detecting a secondary-particle signal emitted from said sample,
   an image generation unit for generating a scanning-ion-microscope image of said sample from a signal sent from said detector,
   a display apparatus for displaying said image generated by said image generation unit, and
   an input apparatus for inputting an instruction from a user, wherein said deflection control system has beam deflection point resolution which is larger than display resolution by said display apparatus, and, when said sample includes repeated cells, said image generation unit generates a scale pattern corresponding to said repeated cells, and superimposes said scale pattern on an image of said repeated cells of said sample, thereby identifying a destination cell inputted from said input apparatus.

2. The charged particle beam apparatus according to claim 1, wherein said image generation unit extends said scale pattern from a start point of said repeated cells of said sample in a transverse direction and in a longitudinal direction until said scale pattern has reached said destination cell inputted from said input apparatus.

3. The charged particle beam apparatus according to claim 1, wherein, when position of said destination cell inputted from said input apparatus has been identified, said image generation unit displays a mark pattern at said identified position such that said mark pattern is superimposed on said identified position.

4. The charged particle beam apparatus according to claim 1, wherein, when position of said destination cell inputted from said input apparatus has been identified, said image generation unit machines a marker at said identified position on said sample.

5. The charged particle beam apparatus according to claim 4, wherein said irradiation system is a focused-ion-beam irradiation system for irradiating said sample with a focused ion beam, said machining of said marker being performed by any one of sputter etching, gas-assisted etching, and gas-assisted deposition using said focused ion beam.

6. The charged particle beam apparatus according to claim 1, wherein said image generation unit generates a zoom image by a combination of a zoom based on beam deflection function of said deflection control system and a zoom based on software.

7. The charged particle beam apparatus according to claim 1, wherein said image generation unit performs an image shift by software without displacing a sample stage.

8. A charged particle beam apparatus, comprising:

an irradiation system for irradiating a sample with a charged particle beam, a deflection control system for deflecting said charged particle beam, a detector for detecting a secondary-particle signal emitted from said sample, an image generation unit for generating an image of said sample from a signal sent from said detector, a display apparatus for displaying said image generated by said image generation unit, and an input apparatus for inputting an instruction from a user, wherein said deflection control system has beam deflection point resolution which is larger than display resolution by said display apparatus, and, when said sample includes repeated cells, said image generation unit identifies a destination cell from disposition number of said repeated cells of said sample in longitudinal and transverse directions and position of said destination cell, said disposition number and said position being inputted from said input apparatus.

9. The charged particle beam apparatus according to claim 8, wherein, when said destination cell inputted from said input apparatus has been identified, said image generation unit machines a marker on said identified destination cell.

10. The charged particle beam apparatus according to claim 9, wherein said irradiation system is a focused-ion-beam irradiation system for irradiating said sample with a focused ion beam.

11. The charged particle beam apparatus according to claim 10, wherein said machining of said marker is performed by any one of sputter etching, gas-assisted etching, and gas-assisted deposition using said focused ion beam.

12. The charged particle beam apparatus according to claim 9, wherein said irradiation system is a focused-electron-beam irradiation system for irradiating said sample with a focused electron beam.

13. The charged particle beam apparatus according to claim 12, wherein said machining of said marker is performed by gas-assisted deposition using said focused electron beam.

14. The charged particle beam apparatus according to claim 8, wherein said irradiation system includes a focused-ion-beam irradiation system for irradiating said sample with a focused ion beam, and a scanning-electron-beam irradiation system for irradiating said sample with a scanning electron beam.

15. The charged particle beam apparatus according to claim 8, further comprising:

a CAD navigation system for performing CAD navigation, a CAD information database for storing CAD information, and a device defect-coordinate information database for storing device defect-coordinate information, wherein a CAD layout pattern is displayed in a manner of being matched to a sample image, a mark pattern for indicating a defect being displayed in a manner of being superimposed on position of said defect of said CAD layout pattern.

16. The charged particle beam apparatus according to claim 8, wherein said image generation unit generates a zoom image by a combination of a zoom based on beam deflection function of said deflection control system and a zoom based on software.

17. The charged particle beam apparatus according to claim 8, wherein said image generation unit performs an image shift by software without displacing a sample stage.

18. A method of detecting a specific cell by using a charged particle beam apparatus, said method comprising the steps of:

irradiating a sample with a charged particle beam, deflecting said charged particle beam, detecting a secondary-particle signal emitted from said sample, generating a scanning-ion-microscope image of said sample from said secondary-particle signal, generating a scale pattern corresponding to repeated cells when said sample includes said repeated cells, and identifying a destination cell by superimposing said scale pattern on a scanning-ion-microscope image of said repeated cells of said sample.

19. A computer-readable program for allowing a computer to execute said method of detecting said specific cell according to claim 18.

20. A method of detecting a specific cell by using a charged particle beam apparatus, said method comprising the steps of:
   irradiating a sample with a charged particle beam,
   deflecting said charged particle beam,
   detecting a secondary-particle signal emitted from said sample,
   generating a scanning-ion-microscope image of said sample from said secondary-particle signal,
   determining disposition of repeated cells of said sample when said sample includes said repeated cells, said disposition being determined based on positions of at least three ends of said repeated cells of said sample, and
   identifying position of a destination cell from said disposition of said repeated cells.

21. A computer-readable program for allowing a computer to execute said method of detecting said specific cell according to claim 20.

* * * * *